United States Patent Office 2,722,512
Patented Nov. 1, 1955

2,722,512

PHOTOPOLYMERIZATION PROCESS

John L. Crandall, Wilmington, Del., assignor to E. I. du Pont de Nemours and Company, Wilmington, Del., a corporation of Delaware No Drawing. Application October 23, 1952, Serial No. 316,565

9 Claims. (Cl. 204—158)

This invention relates to the polymerization, under the influence of light, of compounds subject to addition polymerization.

This application is a continuation-in-part of my copending application Serial No. 218,265, filed March 29, 1951, now abandoned.

The photopolymerization of polymerizable organic compounds is well known but photopolymerization, per se, of the polymerizable compound is impractically slow.

This invention has as an object an acceleration of the photopolymerization of polymerizable organic compounds. Another object is the provision of a process whereby the photopolymerization of photopolymerizable organic compounds can be effected at a practicable rate. Another object is the preparation of a photopolymerizable composition. Other objects will appear hereinafter.

These objects are acomplished by the present invention wherein a photopolymerizable ethylenically unsaturated compound, preferably an organic compound having a terminal ethylenic linkage, is polymerized by irradiating, with light of wave length ranging from 2500 to 7000 Angstrom units, a mixture of said photopolymerizable compound with an α-hydrocarbo-substituted acyloin of the formula

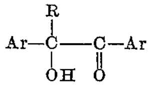

wherein Ar is a monocyclic aryl radical, i. e., a monovalent monocyclic aromatic hydrocarbon radical having its free valence attached to aromatic, i. e., nuclear, carbon and R is a monovalent hydrocarbon radical having 1 to 9 carbon atoms. Particularly good results are obtained with α-substituted acyloins of the above formula in which R is a monovalent aliphatic hydrocarbon radical.

The process of this invention can be carried out by any of the conventional photopolymerization methods, such as bulk, emulsion, granular, and solution polymerization methods. In these methods the rates of polymerization obtained by the use of the α-substituted acyloins are substantially greater than those obtained with the best of the hitherto known photoinitiators, e. g. benzoin and benzoin ethers.

In a preferred manner of carrying out this invention a relatively small amount, e. g. from 0.01% to 2% or even up to 10%, based on the weight of the monomers, of an α-hydrocarbo-substituted acyloin of the above formula, is dissolved in the selected polymerizable ethylenically unsaturated compound and the solution placed in a suitable reaction vessel which is then exposed to light, e. g. visible or ultraviolet light.

Since the rate of polymerization is proportional to the amount of photoinitiator present, it is desirable to use a quantity of the α-substituted acyloin sufficient to produce a practical rate of polymerization. For this reason amounts ranging from 0.02% to 1.0% are preferred. Larger proportions of the photoinitiator can be used but they are less desirable since they increase the amount of color developed in the polymer. As in the case of unsubstituted acyloin and acyloin ether photoinitiated polymerization systems, the development of color can be inhibited by incorporating allyl glycidyl ether in the polymerization system. An amount of allyl glycidyl ether ranging from 0.5% to 15% or more of the weight of the polymeric system is suitable for inhibiting color in these substituted acyloin-catalyzed polymerizations.

The process of this invention is effective when the polymerization system is exposed to light of wave length between 2500 and 7000 Å. Preferably, light of 3000–5000 Å. is employed. Sources of light which are particularly useful include sunlight, mercury arcs, fluorescent light bulbs with special phosphors having maximum emission in the ultraviolet, and sun lamps of the type having both tungsten filaments and mercury arcs which emit light in essentially all wave lengths down to 3000 Å. The rate of photopolymerization is slower with light of the longer wave lengths mentioned above than with light of the shorter wave lengths. Light of 5000 Å. represents the beginning of the band having the less effective wave length. Light of wave length below 2500 Å., e. g. 1800–2200 Å., causes decomposition of some monomers. The rate of polymerization is also proportional to the intensity of the light as well as to the proportion of the photoiniator. However, these factors can be readily controlled so as to obtain a satisfactory rate of polymerization.

The reaction vessels employed in carrying out the process of this invention can be either transparent to light or opaque. When transparent vessels are used, an external source of light can be employed, but opaque reactors require a light source inside the vessel. Reaction vessels suitable for use on a small scale are conveniently made of chemically resistant glass of the borosilicate type, such as "Pyrex."

The α-substituted acyloins used as photoinitiators in the process of this invention can be prepared by various methods. A good general method involves the reaction of an aromatic α-diketone with a Grignard reagent. For example, reaction of benzil with methylmagnesium iodide, and with phenylmagnesium bromide, yields α-methyl- and α-phenylbenzoin, respectively. By another method α-allylbenzoin can be prepared by first reacting benzil with sodium amalgam and then treating the reaction product with an excess of allyl bromide to form the desired α-allylbenzoin. In still another method benzoin is reacted with sodium methoxide to form sodium benzoin which is then reacted with an appropriate hydrocarbon halide, e. g. methyl iodide, tertiary-butyl bromide, allyl bromide or benzyl bromide, to form the corresponding α-substituted benzoin. α-Benzylbenzoin is prepared in accordance with the last method as follows: Sodium methoxide (10.8 parts) is added to 20 parts of benzoin in 176 parts of dry benzene under nitrogen. After stirring and refluxing for five hours, the reaction mixture is cooled to room temperature and 51.3 parts of benzyl bromide is added. Stirring is continued for an hour at room temperature and then for five hours at 50–55° C. Filtration followed by distillation of the filtrate under reduced pressure leaves a residue which is recrystallized from heptane giving 13.4 parts, corresponding to a yield of 47%, of α-benzylbenzoin, M. P. 114–116° C. Recrystallization of this product from alcohol raises the melting point to 119.5–120° C. The infrared absorption spectrum of this compound agrees with that of α-benzylbenzoin made by the Grignard method and shows clearly the presence of carbonyl and hydroxyl groups. Absorption bands at 2.85 $\mu$ for hydroxyl group and at 5.95 $\mu$ for carbonyl group are present.

*Analysis.*—Calculated for $C_{21}H_{18}O_2$: C, 83.42%; H, 6.00%. Found: C, 83.71%, 83.84%; H, 6.30%, 6.38%. An oxime of α-benzylbenzoin, M. P. 175–176° C., is formed. There is no depression in melting point when this oxime is mixed with an authentic specimen of α-benzylbenzoin oxime.

Certain of the α-hydrocarbo-substituted benzoins employed as photopolymerization initiators in the process of this invention, while known compounds, have had ascribed to them incorrect formulae, i. e., that of ethers of α,α'-dihydroxystilbene. Thus α-allylbenzoin and α-methylbenzoin were produced by Bachman (J. Am. Chem. Soc. 56, 963–5 (1934)), but were termed stilbenediallyl ether and stilbenedimethyl ether by him. This is based on the identity between authentic α-hydrocarbon substituted benzoins and the supposed diethers of α,α'-stilbenediol, in melting points, ultraviolet spectra, infrared spectra, and analyses. The infrared spectra showed clearly the presence of carbonyl and hydroxyl groups and the carbon analyses of the allyl and benzyl derivatives check the calculated values for α-substituted benzoins. Also, the α-substituted bezoins form oximes which agree in melting point with oximes of authentic α-substituted benzoins.

The following examples in which parts are by weight are illustrative of the invenion.

EXAMPLE I

A "Pyrex" glass reaction tube is charged with 2.0 parts of freshly distilled monomeric methyl methacrylate and 0.02 part of α-allylbenzoin. The tube is flushed with nitrogen (introduced through a long capillary tube), cooled in a mixture of solid carbon dioxide and acetone, evacuated, and sealed under vacuum. The tube and its contents are exposed to the light of two 15-watt fluorescent bulbs having maximum emission of light at about 3600 Å contained in a reflector fixture and placed at a distance of about two inches from the reaction tube. The methyl methacrylate is essentially completely polymerized in an hour to a clear colorless solid. Under the same conditions of exposure but in the absence of the α-allylbenzoin, methyl methacrylate requires approximately eight hours to polymerize.

EXAMPLE II

The process of Example I is repeated, but with the exception that 0.02 part of α-tertiary-butylbenzoin is substituted for the α-allylbenzoin. As in Example I, the polymerization of the methyl methacrylate is essentially complete within an hour.

EXAMPLE III

A "Pyrex" glass reaction tube is charged with two parts of freshly distilled acrylonitrile monomer and 0.02 part of α-allylbenzoin and polymerized as described in Example I. Polymerization is very rapid, a copious precipitate of polyacrylonitrile being obtained within ten minutes.

EXAMPLE IV

The process of Example III is repeated using two parts of monomeric vinyl acetate as the monomer and 0.02 part of α-methylbenzoin as the photoinitiator. The vinyl acetate polymerizes essentially completely in two hours.

EXAMPLE V

A "Pyrex" glass reaction tube is charged with two parts of freshly distilled monomeric methyl acrylate and 0.02 part of α-methylbenzoin. Polymerization is carried out in the manner of Example I. A clear solid polymer of methyl acrylate is obtained in 15 minutes.

EXAMPLE VI

The process of Example V is repeated with the single exception that two parts of monomeric styrene is substituted for the methyl acrylate of that example. The rate of polymerization of styrene is lower than that of methyl acrylate, 24 hours being required to obtain substantial polymerization. Monomeric styrene containing no initiator and exposed under the same conditions is not appreciably polymerized in 48 hours.

EXAMPLE VII

The process of Example I is repeated with the exception that 0.02 part of α-benzylbenzoin is substituted for the α-allylbenzoin initiator. The methyl methacrylate is essentially completely polymerized in an hour.

EXAMPLE VIII

The process of Example I is repeated with the exception that the α-allylbenzoin is replaced by 0.02 part of α-phenylbenzoin. As in the preceding example, the methyl methacrylate is substantially completely polymerized in an hour.

EXAMPLE IX

An unsaturated alkyd resin is prepared by reacting cocoanut oil, pentaerythritol, maleic anhydride, and triethylene glycol to give a resin represented by the following composition: cocoanut oil 17.15 parts, triethylene glycol maleate 72.85 parts, pentaerythritol dimaleate 8.05 parts, and triethylene glycol 1.95 parts. To 140 parts of the above resin are added 60 parts of styrene and 1 part of α-allylbenzoin. The mixture is stirred to give a smooth syrup with a viscosity of approximately 12 poises. A polymerization cell is prepared by placing spacers 0.2 inch thick on a glass plate near the edges. With the plate in a horizontal position, syrup is poured onto the plate to give a 0.2 inch thick layer which is held in position by the spacers. The cell is closed by covering the syrup with a second plate of glass to which a sheet of cellophane has been squeegeed, using a film of petrolatum as an adhesive. The cellophane side is placed in contact with the syrup.

The assembly, in a horizontal position, is then placed under, and at a distance of 16 inches from, a 100-watt mercury vapor sun lamp which emits 5.7 watts of ultraviolet light of wave length 2800 to 3800 Å, and 12 watts of visible light of wave length 3800 to 7600 Å, with substantially no emission of light below 2800 Å, and irradiated for a total of 32 minutes. During the exposure successive portions of the cell are covered with a metal plate so that exposure steps of 4, 8, 16, and 32 minutes are obtained in the same cell. After completion of the exposure, the top glass plate is removed and the cellophane peeled off. By means of a Shore A–2 durometer, the hardness of the four steps is measured (A. S. T. M. method D676–49T). Results are as follows:

| Exposure Step | Shore A–2 Durometer Hardness |
|---|---|
| 4 min | 0 (very soft gel). |
| 8 min | 13. |
| 16 min | 50. |
| 32 min | 83. |

A portion of the product from the 32 minute step is placed in toluene and allowed to remain for 64 hours at room temperature. There is no apparent swelling of the product and the edges are still as sharp as when the sample was placed in the solvent, thus indicating that the internal double bonds of the alkyd resin participated in the photopolymerization to give a cross-linked material unaffected by a solvent for unmodified polystyrene.

The examples have illustrated the invention by the photopolymerization of certain polymerizable unsaturated organic compounds and mixtures of such compounds. However, the process is generically applicable to the photopolymerization of terminally and non-terminally unsaturated ethylenic compounds. Specific terminally unsaturated compounds, which are a preferred type, include, in addition to those shown above, acrylic, α-alkylacrylic, and α-chloroacrylic acid compounds such as esters, amides, and nitriles, e. g., acrylonitrile, methacrylonitrile, ethyl acrylate, isobutyl methacrylate, methacrylamide, and methyl α-chloroacrylate; vinyl and vinylidene compounds such as vinyl and vinylidene esters, ethers, and ketones, e. g., vinyl propionate, vinyl chloride, vinylidene chloride, divinyl formal, and methyl vinyl ketone; and hydrocarbons having a terminal ethylenic linkage, e. g., styrene. In addition, compounds having more than one terminal unsaturation can be used. These include isoprene, and chloroprene, diallyl phthalate, ethylene glycol dimethacrylate, tetraethylene glycol dimethacrylate, glycerol trimethacrylate, methacrylic anhydride, divinylbenzene, alkyd resins derived from glycerol, phthalic acid, and methacrylic acid, etc. Likewise, other non-terminally unsaturated compounds which can be used include diethyl fumarate, linear polybutadienes, and unsaturated polyesters such as those derived from unsaturated dibasic acids, e. g., maleic and fumaric acids, with glycols, e. g., ethylene glycol, diethylene glycol, propylene glycol, pentamethylene glycol, etc.

Mixtures of two or more of these or other ethylenically unsaturated compounds can be polymerized by the process of this invention. In general, compounds possessing internal unsaturation are most advantageously used in combination with terminally unsaturated monomers because of the higher polymerization speeds obtained thereby.

In the process of this invention substituted acyloins of the formula

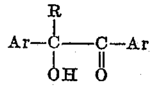

wherein R is a monovalent hydrocarbon radical having 1 to 9 carbon atoms, and Ar is a monovalent monocyclic aromatic hydrocarbon radical, are of generic applicability. Such acyloins in which R in the above formula is an aliphatic hydrocarbon radical of 1 to 4 carbons and in which Ar is phenyl are especially suitable. Other α-substituted acyloins which can be employed include α-ethylbenzoin, α-propylbenzoin, α-methyltoluin, and α-(n-nonyl)benzoin.

The superiority of the α-substituted acyloins as initiators for the photopolymerization of ethylenically unsaturated organic compounds is shown by the results of the experiments summarized in the following table. In these experiments "Pyrex" reaction tubes were charged as in Example I with freshly distilled monomeric methyl methacrylate and the indicated amount (per cent by weight of the methyl methacrylate monomer) of photoinitiator and polymerized under the conditions of Example I in an oblique line refractometer adapted for photochemical work. The course of the reaction was followed by the changes in the refractive index of the polymerization system and the table lists the reaction rates of these polymerizations during the first ten to twenty per cent polymerization (where the reaction is at least pseudo-first order.)

*Table I*

PHOTOPOLYMERIZATION OF METHYL METHACRYLATE

| Photoinitiator | Conc. Per-cent by weight | Percent Polymerization Per Minute | Percent Polym./min. / $\sqrt{\text{init. conc.}}$ |
|---|---|---|---|
| α-Methylbenzoin | 0.2 | 0.232 | 0.520 |
| | 0.1 | 0.162 | 0.512 |
| | 0.05 | 0.112 | 0.500 |
| α-Allylbenzoin | 0.2 | 0.234 | 0.525 |
| | 0.1 | 0.163 | 0.515 |
| Benzoin | 0.2 | 0.17 | 0.381 |
| | 0.1 | 0.125 | 0.395 |
| | 0.05 | 0.087 | 0.389 |

From these data it is seen that α-allyl- and α-methylbenzoin are equivalent on a weight basis, and about one-third more efficient than unsubstituted benzoin, one of the best of the previously known photoinitiators. The rates vary with the square root of the catalyst concentration.

The α-substituted acyloins are also superior to the known acyloin ethers in their effect on the photopolymerization rate of ethylenically unsaturated compounds. This is evident from a comparison of the polymerization rate obtained in the polymerization of methyl methacrylate containing 0.2% by weight of the photoinitiator and exposed to a light source having a maximum emission of light at 3600 Å. but of a greated intensity than the light used in the experiments outlined in Table I. Under the more intense light of these experiments the polymerization rate of methyl methacrylate with benzoin as photoinitiator was 0.30% per minute, and with benzoin ethyl ether the rate was 0.38% per minute. Conversion of these polymerization rates to rates obtainable with light of the same intensity as that used in the experiments listed in Table I gives a polymerization rate for the benzoin initiated reaction of 0.17% per minute, and for the benzoin ethyl ether initiated reaction 0.215% per minute. In comparison, the α-methyl- and α-allylbenzoins produce (at the same concentration of initiator) polymerization rates of 0.232% and 0.234% per minute respectively.

The incorporation of allyl glycidyl ether in the photopolymerization systems of this invention inhibits discoloration of the polymer caused by the α-substituted acyloin used as photoinitiator. The use of allyl glycidyl ether to prevent discoloration in photopolymerization systems containing acyloins or acyloin ethers as photoinitiators is described in U. S. application Serial No. 171,561, filed June 30, 1950, by R. M. Joyce, now Patent 2,647,080.

The photopolymerization process of this invention is, because of its superior rate of polymerization even at relatively low temperatures and because of the high degree of control attainable, particularly suitable for use in the polymerization of cements used in joining transparent plastic articles. It is also particularly useful for the polymerization of ethylenically unsaturated compounds into shaped articles of excellent quality in shorter times than possible with the other types of photoinitiators. Photopolymerizable compositions containing α-substituted acyloins are especially suitable for use in the preparation of plastic printing plates, such as described in U. S. application Serial No. 242,790, filed August 20, 1951, by L. Plambeck, Jr., now abandoned and replaced by his copending application Serial No. 326,841.

The foregoing detailed description has been given for clearness of understanding only and no unnecessary limitations are to be understood therefrom. The invention is not limited to the axact details shown and described for obvious modifications will occur to those skilled in the art.

What is claimed is:

1. Process of preparing polymers comprising irradiating, with light having a wave length of 2500 to 7000 Angstroms, monomeric methyl methacrylate containing 0.02 to 1.0%, by weight thereof, of α-allylbenzoin.

2. Process of preparing polymers comprising irradiating, with light having a wave length of 2500 to 7000 Angstroms, monomeric methyl methacrylate containing 0.02 to 1.0%, by weight thereof, of an α-substituted acyloin, said acyloin having the formula

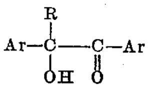

wherein R is a monovalent hydrocarbon radical having 1 to 9 carbon atoms and Ar is a monocyclic aryl radical.

3. Process of preparing polymers comprising irradiating, with light having a wave length of 2500 to 7000 Angstroms, a photopolymerizable ethylenically unsaturated compound containing at least 0.01%, by weight of said compound, of an α-substituted acyloin, said acyloin having the formula

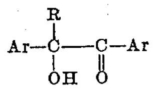

wherein R is a monovalent hydrocarbon radical having 1 to 9 carbon atoms, and Ar is a monocyclic aryl radical.

4. Process of preparing polymers comprising irradiating, with light having a wave length of 2500 to 7000 Angstroms, a photopolymerizable ethylenically unsaturated compound in an inert atmosphere and containing at least 0.01%, by weight of said compound, of an α-substituted acyloin, said acyloin having the formula

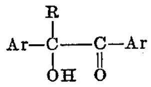

wherein R is a monovalent hydrocarbon radical having 1 to 9 carbon atoms, and Ar is a monocyclic aryl radical.

5. Process of preparing polymers comprising irradiating, with light having a wave length of 2500 to 7000 Angstroms, a photopolymerizable terminally ethylenically unsaturated compound containing at least 0.01%, by weight of said compound, of an α-substituted acyloin of the formula

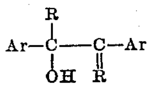

wherein R is a monovalent hydrocarbon radical having 1 to 9 carbon atoms and Ar is a monocyclic aryl radical.

6. Process of preparing polymers comprising irradiating, with light having a wave length of 2500 to 7000 Angstroms, a photopolymerizable terminally ethylenically unsaturated compound in an inert atmosphere and containing at least 0.01%, by weight of said compound, of an α-substituted acyloin, said acyloin having the formula

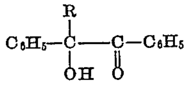

wherein R is a monovalent aliphatic hydrocarbon radical of 1 to 4 carbons.

7. A photopolymerizable composition comprising essentially an ethylenically unsaturated compound containing dispersed therein from 0.1% to 10% of an α-substituted acyloin, said acyloin having the formula

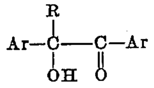

wherein R is a monovalent hydrocarbon radical having 1 to 9 carbon atoms and Ar is a monovalent monocyclic aromatic hydrocarbon radical.

8. A composition of claim 7 wherein the ethylenically unsaturated compound is terminally unsaturated.

9. A photopolymerizable composition comprising essentially a mixture of photopolymerizable ethylenically unsaturated compounds containing dispersed therein from 0.1% to 10%, by weight of said mixture, of an α-substituted acyloin, said acyloin having the formula

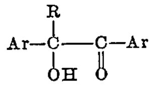

wherein R is a monovalent hydrocarbon radical having 1 to 9 carbon atoms and Ar is a monovalent monocyclic aromatic hydrocarbon radical.

References Cited in the file of this patent

UNITED STATES PATENTS

| | | |
|---|---|---|
| 2,367,661 | Agre | Jan. 23, 1945 |
| 2,448,828 | Renfrew | Sept. 7, 1948 |
| 2,647,080 | Joyce | July 28, 1953 |